United States Patent
Vershinin

(10) Patent No.: US 10,498,328 B2
(45) Date of Patent: Dec. 3, 2019

(54) SEMICONDUCTOR SWITCHING STRING

(71) Applicant: General Electric Technology GmbH, Baden (CH)

(72) Inventor: Konstantin Vershinin, Stafford (GB)

(73) Assignee: GENERAL ELECTRIC TECHNOLOGY GMBH, Baden (CH)

(*) Notice: Subject to any disclaimer, the term of this patent is extended or adjusted under 35 U.S.C. 154(b) by 0 days.

(21) Appl. No.: 15/764,885

(22) PCT Filed: Sep. 27, 2016

(86) PCT No.: PCT/EP2016/072911
§ 371 (c)(1),
(2) Date: Mar. 30, 2018

(87) PCT Pub. No.: WO2017/055243
PCT Pub. Date: Apr. 6, 2017

(65) Prior Publication Data
US 2018/0323777 A1    Nov. 8, 2018

(30) Foreign Application Priority Data

Sep. 30, 2015  (GB) .................................. 1517248.9

(51) Int. Cl.
*H03K 17/16*  (2006.01)
*H02M 5/458*  (2006.01)
(Continued)

(52) U.S. Cl.
CPC .............. *H03K 17/105* (2013.01); *H02J 3/36* (2013.01); *H02M 1/088* (2013.01); *H02M 1/34* (2013.01); *H02M 2001/348* (2013.01)

(58) Field of Classification Search
CPC ...... H03K 17/105; H02M 1/34; H02M 1/088; H02M 2001/348; H02J 3/36
See application file for complete search history.

(56) References Cited

U.S. PATENT DOCUMENTS 7,830,196 B2 * 11/2010 Omaru ................ H01L 27/0248
                                                               327/309
9,813,054 B2 * 11/2017 Davidson ......... H03K 17/08144
9,819,337 B2    11/2017 Davidson

FOREIGN PATENT DOCUMENTS

EP    2 955 837 A1    12/2015
EP    2 955 838 A1    12/2015
(Continued)

OTHER PUBLICATIONS

Search Report issued in connection with corresponding GB Application No. 1517248.9 dated Mar. 29, 2016.

*Primary Examiner* — Kenneth B Wells
(74) *Attorney, Agent, or Firm* — Eversheds Sutherland (US) LLP

(57) ABSTRACT

A semiconductor switching string includes series-connected semiconductor switching assemblies, each having a main semiconductor switching element that, when switched on, conducts current flow from a first terminal to a second terminal, and that, while turning off, transitions from a reverse recovery mode in which a reverse recovery current flows from the second terminal to the first terminal to a blocking mode in which no current flows. Each main semiconductor switching element has an active auxiliary circuit, each including an auxiliary semiconductor switching element and a resistive element. Each control unit is connected with each auxiliary semiconductor switching element. Each control unit switches a respective auxiliary semiconductor switching element into a conducting state to divert current through the corresponding resistive element. Each control unit having the auxiliary semiconductor switching elements in their conducting state simultaneously while each main semiconductor switching element is operating in reverse recovery mode or blocking mode.

12 Claims, 2 Drawing Sheets

(51) Int. Cl.
*H03K 17/10* (2006.01)
*H02J 3/36* (2006.01)
*H02M 1/088* (2006.01)
*H02M 1/34* (2007.01)

(56) References Cited

FOREIGN PATENT DOCUMENTS

| | | | | |
|---|---|---|---|---|
| EP | 3 029 833 A1 | 6/2016 | | |
| GB | 1 530 920 A | 11/1978 | | |
| GB | 2528980 A | 2/2016 | | |
| WO | 2014/198730 | * 12/2014 | ......... | H03K 17/0814 |
| WO | WO-2014198734 A1 | * 12/2014 | ....... | H03K 17/08144 |

* cited by examiner

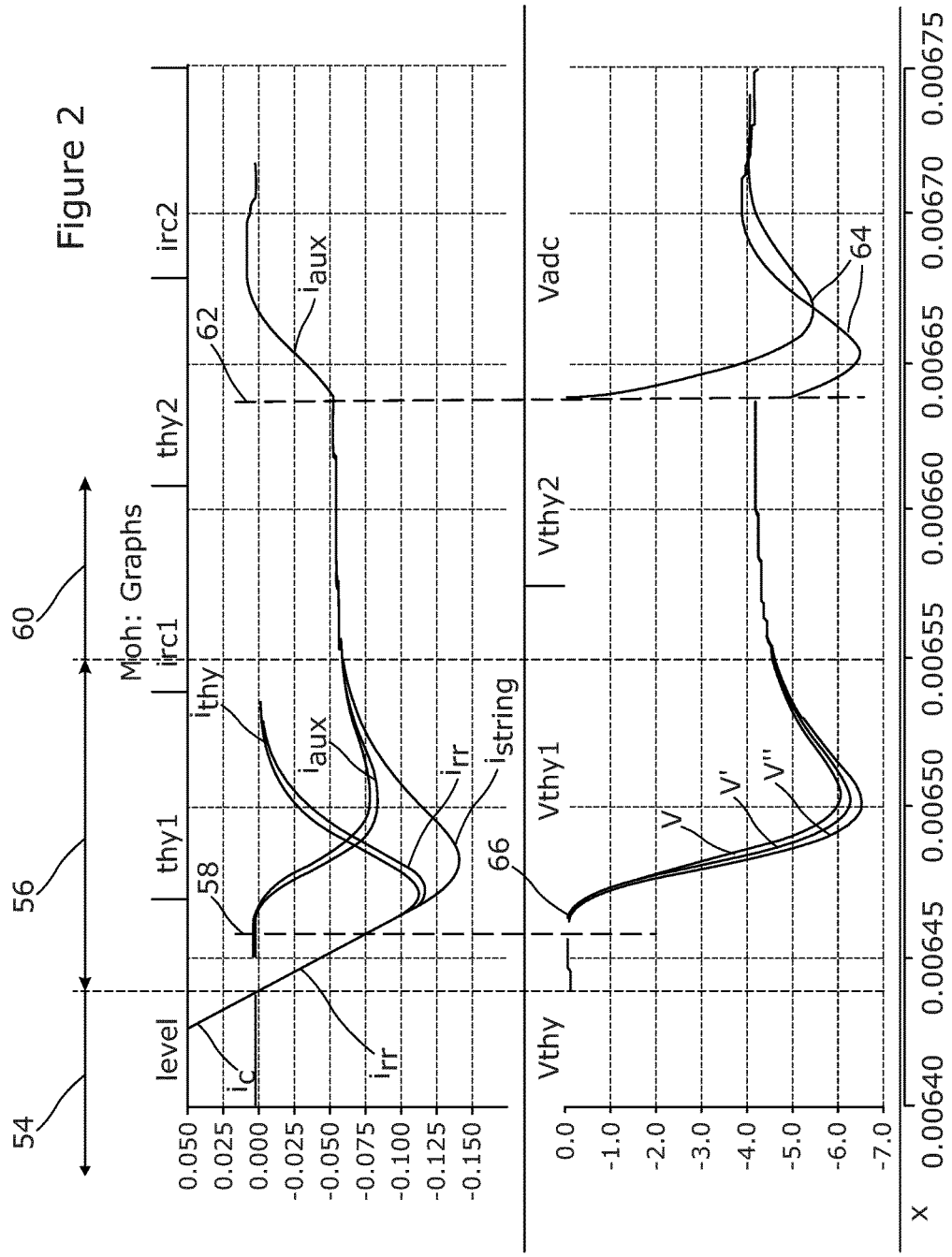

SEMICONDUCTOR SWITCHING STRING

FIELD OF INVENTION

This invention relates to a semiconductor switching string for use in a high voltage direct current (HVDC) power converter.

BACKGROUND OF THE INVENTION

In power transmission networks alternating current (AC) power is typically converted to direct current (DC) power for transmission via overhead lines and/or under-sea cables. This conversion removes the need to compensate for the AC capacitive load effects imposed by the transmission line or cable and reduces the cost per kilometer of the lines and/or cables, and thus becomes cost-effective when power needs to be transmitted over a long distance.

HVDC power converters are used to convert AC power to DC power. Semiconductor switching elements, such as thyristors, are a key component of HVDC power converters, and act as controlled rectifiers to convert AC power to DC power and vice versa.

While such semiconductor switching elements have very high breakdown voltages and are capable of carrying high current loads, even semiconductor switching elements from the same batch exhibit different performance characteristics. This creates difficulties in the operation of, e.g. a HVDC power converter in which the semiconductor switching elements are incorporated.

SUMMARY

According to a first aspect of the invention there is provided a semiconductor switching string, for use in a HVDC power converter, comprising:

a plurality of series-connected semiconductor switching assemblies, each semiconductor switching assembly having a main semiconductor switching element, each main semiconductor switching element when switched on operating in a conducting mode in which a conducting current flows from a first terminal thereof to a second terminal thereof, each main semiconductor switching element while turning off transitioning from a reverse recovery mode in which a reverse recovery current flows from the second terminal to the first terminal to a blocking mode in which no current flows between the first and second terminals, each main semiconductor switching element having an active auxiliary circuit electrically connected between the first and second terminals thereof, and each active auxiliary circuit including an auxiliary semiconductor switching element and a resistive element connected in series with one another; and a control unit operatively connected with each auxiliary semiconductor switching element, the or each control unit being configured to switch a respective auxiliary semiconductor switching element into a conducting state to divert current through the corresponding resistive element, and the or each control unit being further configured to have all of the auxiliary semiconductor switching elements in their conducting state simultaneously at least while each main semiconductor switching element is operating in one of its reverse recovery mode or its blocking mode, whereby when a given main semiconductor switching element transitions to operating in its blocking mode the voltage thereacross is determined solely by the voltage across the resistive element in the corresponding active auxiliary circuit electrically connected between the first and second terminals of the said given main semiconductor switching element.

Having the voltage across the or each main semiconductor switching element which is operating in its blocking mode determined solely by the voltage across the resistive element in the corresponding active auxiliary circuit is advantageous because it allows the said voltage across the or each such main semiconductor switching element to be established by a resistance value of the corresponding resistive element.

Such resistance values can be controlled very accurately to tight manufacturing tolerances and so it is possible to accurately control the voltage arising across the or each such main semiconductor switching element. The ability to provide accurate voltage control in turn permits precise management of the sharing of voltage by the various semiconductor switching elements in the semiconductor switching string.

In an embodiment, the or each control unit is additionally configured to subsequently turn off simultaneously all of the auxiliary semiconductor switching elements to simultaneously stop the flow of current through each auxiliary circuit and associated resistive element.

Turning off, i.e. switching into a non-conducting state, each auxiliary semiconductor switching element to simultaneously stop the flow of current through each resistive element further helps to maintain accurate control of the voltage across each main semiconductor switching element that is operating in its blocking mode.

Optionally the or each control unit is configured to simultaneously turn off all of the auxiliary semiconductor switching elements following an event experienced within the semiconductor switching string.

The event may be one of:
the turning on of each auxiliary semiconductor switching element;
a peak voltage arising across one or both of the corresponding main semiconductor switching element and the semiconductor switching string;
the receipt of a dedicated turn-off signal from a higher-level controller;
a stabilisation of the current flowing through each auxiliary circuit; and
a stabilisation of the voltage across one or both of the corresponding main semiconductor switching element and the semiconductor switching string.

The foregoing features desirably permit the reliable, accurate and repeatable simultaneous turn off of all of the auxiliary semiconductor switching elements by the or each associated control unit.

In a preferred embodiment of the invention the resistive element in each auxiliary circuit has a resistance value which results in the amount of current that continues to flow through the resistive element once the corresponding main semiconductor switching element is operating in its blocking mode equating to at least 10% of the peak reverse recovery current flowing through the said corresponding main semiconductor switching element when it is operating in its reverse recovery mode.

The resistive element in each auxiliary circuit may have a resistance value which results in the amount of current that continues to flow through the resistive element once the corresponding main semiconductor switching element is operating in its blocking mode equating to between 30% and 40% of the peak reverse recovery current flowing through the said corresponding main semiconductor switching element when it is operating in its reverse recovery mode.

The inclusion of a resistive element having such resistive values helps to ensure that the resulting string of auxiliary circuits created when all of the auxiliary semiconductor switching elements are switched on simultaneously is able to handle a desired level of current to allow, e.g. continued operation of a HVDC power converter in which in an embodiment is located, while at the same time permitting each resistive element to have a desired degree of influence on the voltage arising across the corresponding main semiconductor switching element.

In a further preferred embodiment of the invention the resistive element in each auxiliary circuit has the same resistance value.

Such an arrangement means that the voltage across each resistive element in the semiconductor switching string will be the same when each of the associated auxiliary semiconductor switching elements is in its conducting state, such that the voltage arising across each of the various main semiconductor switching elements, when operating in their blocking mode, will also be the same.

As a consequence, having all of the auxiliary semiconductor switching elements in their conducting state simultaneously has the effect of causing, within a few tens of microseconds, an equal voltage to arise across all of the main semiconductor switching elements operating in their blocking mode. Such equalising of the voltage arising across each individual main semiconductor switching element is particularly desirable since it helps contribute to optimum operation of the semiconductor switching string of the invention, e.g. within a HVDC power converter.

Optionally each auxiliary semiconductor switching element includes at least one self-commutated semiconductor switch.

Respective self-commutated semiconductor switches, i.e. switches that can be switched on and off via a gate control, exhibit a much lower variation in turn-off performance characteristics than, e.g. naturally commutated semiconductor switches (such as conventional thyristors) which can be turned on via a gate control but can only be turned off by arranging the circuit in which they are located to force the current flowing through them to fall to zero and then maintaining a period (typically of a few hundred microseconds) during which they are reverse-biased.

Such a low variation in turn-off performance characteristics allows for much more accurate turning off, i.e. more accurate simultaneous turning off, of such devices which in turn helps to maintain accurate control of the voltage across a corresponding main semiconductor switching element.

In an embodiment, the or each self-commutated switch includes a snubber circuit connected in parallel thereacross.

The inclusion of one or more such snubber circuits desirably helps to suppress a rise in voltage across the or each self-commutated switch when they are turned off, and also helps to ensure that the rate of change of voltage across the corresponding main semiconductor switching element is kept within safe limits.

In addition, the inclusion of a capacitive component in such a snubber circuit provides a useful source of power for, e.g. the or each associated control unit.

One or more of the or each control unit may be still further configured to have at least one auxiliary semiconductor switching element in its conducting state while the corresponding main semiconductor switching element is operating in its conducting mode.

Having a given auxiliary semiconductor switching element switched on while the main semiconductor switching element associated therewith is operating in its conducting mode creates a discharge path for the capacitive component within the snubber circuit through the auxiliary semiconductor switching element rather than through the corresponding main semiconductor switching element. This reduces the current stress that the main semiconductor switching element would otherwise experience when switching into its conducting mode, i.e. when turning on.

Optionally the or each control unit is configured to have all of the auxiliary semiconductor switching elements in their conducting state simultaneously a predetermined period of time after a given reference point in the operating cycle of the semiconductor switching string.

Such a feature means that the or each control unit is able to adopt an open loop mode of control in which it is not reliant on feedback from other elements which might otherwise increase the complexity of the or each control unit and/or require a more extensive communications network to convey the said feedback.

In an embodiment, the given reference point is one of:
dispatch of a switch-on signal to each main semiconductor switching element;
dispatch of a switch-on signal to a further semiconductor switching string with which the semiconductor switching string of in an embodiment is operatively associated; and
a zero voltage arising across one or both of the corresponding main semiconductor switching element and the semiconductor switching string.

The foregoing features desirably permit the reliable, accurate and repeatable simultaneous turn on, i.e. switching into their conducting state, of all of the auxiliary semiconductor switching elements by the or each associated control unit.

BRIEF DESCRIPTION OF THE DRAWINGS

There now follows a brief description of preferred embodiments of the invention, by way of non-limiting example, with reference to the following figures in which:

FIG. 2 illustrates current and voltage levels during operation of a given semiconductor switching assembly which forms a part of the semiconductor switching string shown in FIG. 1.

DETAILED DESCRIPTION

Figure 1:
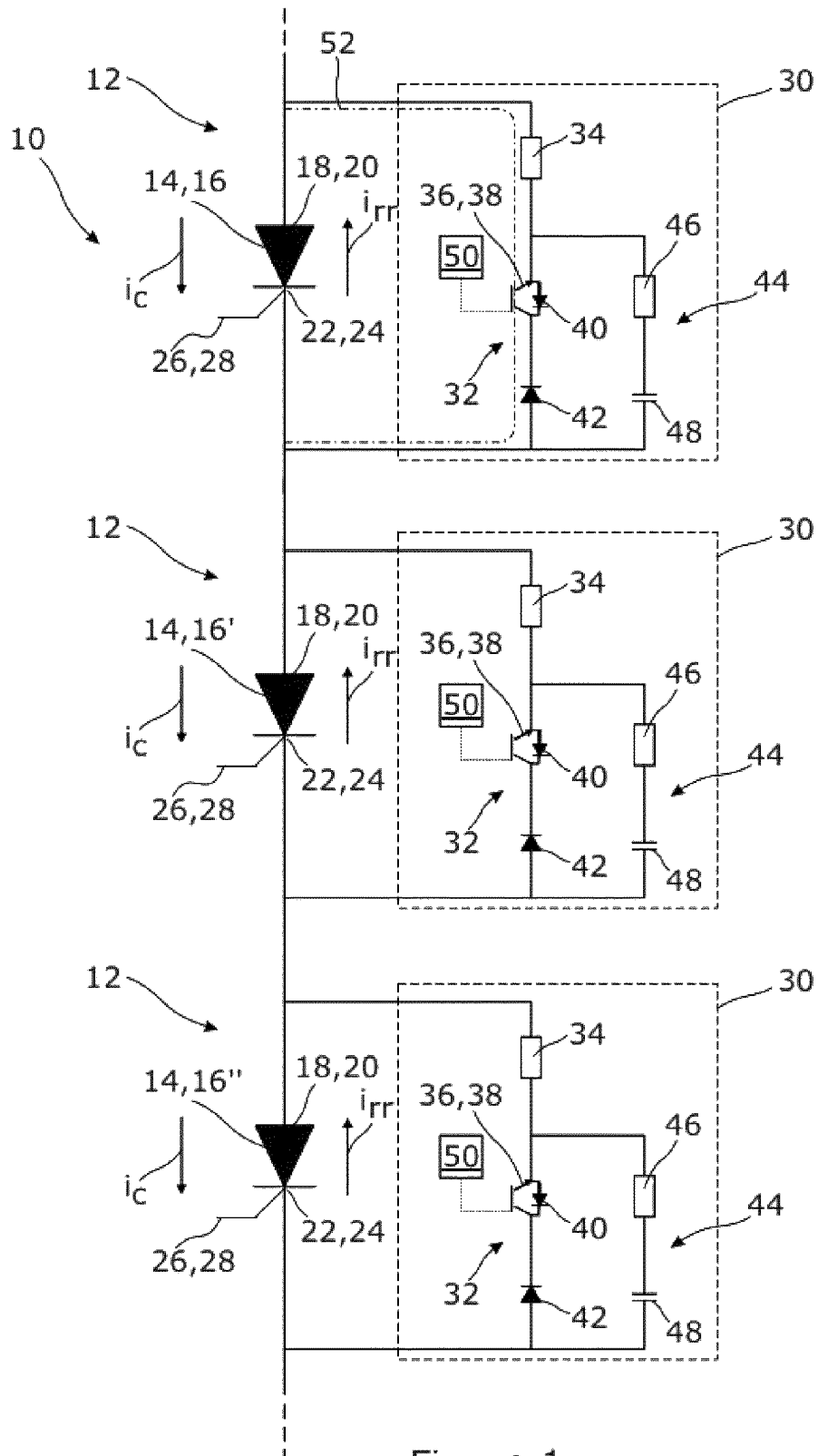
FIG. 1 shows a portion of a semiconductor switching string according to a first embodiment of the invention.

A semiconductor switching string according to a first embodiment of the invention is designated generally by reference numeral 10, as shown in FIG. 1.

The semiconductor switching string 10 includes a plurality of series-connected semiconductor switching assemblies 12, each of which semiconductor switching assembly 12 includes a main semiconductor switching element 14. Only three semiconductor switching assemblies 12 are shown in FIG. 1 although the semiconductor switching string 10 may include many tens of such semiconductor switching assemblies 12 and even many hundreds of semiconductor switching assemblies 12.

In the embodiment shown each main semiconductor switching element 14 is a main thyristor 16, 16', 16", although in other embodiments of the invention a different main semiconductor switching element 14 may be used such as a diode, Light-Triggered Thyristor (LTT), Gate Turn-Off thyristor (GTO), Gate Commutated Thyristor (GCT) or Integrated Gate Commutated Thyristor (IGCT). In an embodiment, the main semiconductor switching element 14 is optimised for lowest conduction (on-state) losses at the expense of other parameters such as turn-off performance characteristics.

Each main thyristor 16, 16', 16" shown includes an anode 18 which defines a first terminal 20, a cathode 22 which defines a second terminal 24, and a gate 26 that defines a control terminal 28 via which the main thyristor 18 may be switched on.

More particularly, each main thyristor 16, 16', 16" is naturally commutated, and so while it can be turned on via the aforementioned gate 26, i.e. the control terminal 28, it can only be turned off by arranging the circuit in which it is located to force the current flowing through it to fall to zero and then maintaining a period (typically of a few hundred microseconds) during which it is reverse-biased, i.e. during which a negative voltage is applied between the first and second connection terminals 20, 24.

When switched on each main thyristor 16, 16', 16" operates in a conducting mode in which a conducting current $i_c$ flows from the first terminal 20 to the second terminal 24. While turning off, i.e. while naturally commutating, each main thyristor 16, 16', 16" transitions from a reverse recovery mode, in which a reverse recovery current in flows from the second terminal 24 to the first terminal 20, to a blocking mode in which no current flows between the first and second terminal 20, 24.

Each main semiconductor switching element 14, i.e. each main thyristor 16, 16', 16", has an active auxiliary circuit 30 electrically connected between the aforementioned first and second terminals 20, 24 so as to lie in parallel with the corresponding main semiconductor switching element 14. Within the context of the invention 'active' is intended to mean that the auxiliary circuit can be controlled at will, i.e. switched between operative and inoperative configurations, e.g. by an electronic programmable control unit, rather than its use being controlled by passive components such as resistors and capacitors which are able only to react to changes in a current flowing therethrough or a voltage applied thereto and are unable make an operational decision independently of such a current or voltage.

Each auxiliary circuit 30 includes an auxiliary semiconductor switching element 32 and a resistive element 34 which are connected in series with one another.

In the embodiment shown, each auxiliary semiconductor switching element 32 includes a single self-commutated semiconductor switch 36, i.e. a semiconductor switch 36 that can be switched on and off via a signal applied to a gate control within the switch 36. By way of example, the semiconductor switch 36 shown is an insulated-gate bipolar transistor (IGBT) 38, but other possible self-commutated semiconductor switches 36 include metal-oxide-semiconductor field-effect-transistors (MOSFETs), gate turn-off transistors (GTOs), bipolar junction transistors (BJTs) and integrated gate-commutated thyristors (IGCTs).

Each IGBT 38 is connected in anti-parallel with the corresponding main thyristor 16, 16', 16" and itself includes an anti-parallel diode 40 connected thereacross.

In addition, each auxiliary semiconductor switching element 32 shown includes a series-connected diode 42 to provide a reverse current blocking capability. Each auxiliary semiconductor switching element 32 also has a snubber circuit 44 connected in parallel across both the self-commutated switch 36, i.e. the IGBT 38, and the series-connected diode 42. Each snubber circuit 44 includes a snubber resistor 46 and a capacitive component, in the form of a snubber capacitor 48, which are connected in series with one another. In other embodiments of the invention, some or all of the snubber circuits may be connected in parallel across only the self-commutated switch.

In other embodiments of the invention (not shown) one or more of the auxiliary semiconductor switching elements 32, e.g. those in which the corresponding self-commutated semiconductor switch 36 is able to provide a symmetrical voltage blocking capability, may omit the series-connected diode 42. In such arrangements the corresponding self-commutated semiconductor switch 36 is likely to be based on a wide-band gap material such as silicon carbide.

In still further other embodiments of the invention (also not shown) one or more of the auxiliary semiconductor switching elements 32 may include a plurality of self-commutated semiconductor switches 36 which are connected in series with one another. Each such semiconductor switch 36 may include its own anti-parallel diode 40 and associated series-connected diode 42. Such multiple semiconductor switch 32 and diode 40, 42 combinations may each have their own respective snubber circuit connected in parallel thereacross, or a number of semiconductor switch 32 and diode 40, 42 combinations may instead have a single snubber circuit connected in parallel thereacross.

Returning to the embodiment partially shown in FIG. 1, each resistive element 34 is in the form of a resistor, although other types of resistive element may also be used. Each resistor has a resistance value which, in use, results in the amount of current that continues to flow through the resistive element 34 once the corresponding main thyristor 16, 16', 16" is operating in its blocking mode, i.e. once the corresponding main thyristor 16, 16', 16" has turned off completely, equating to at least 10%, and in an embodiment between 30% and 40%, of the peak reverse recovery current in flowing through the said corresponding main thyristor 16, 16', 16" when it is operating in its reverse recovery mode.

More particularly each resistive element 34 has the same resistance value (so far as is possible with very tight manufacturing tolerances) which, by way of example, would lie in the range of 75Ω to 90Ω. The resistance value could, however, lie outside the aforementioned range depending on the type of main thyristor 16, 16', 16" and the peak reverse recovery current in associated with the said main thyristor 16, 16', 16" included in the semiconductor switching string 10.

As well as the plurality of semiconductor switching assemblies 12 mentioned hereinabove, the semiconductor switching string 10 of the invention also includes a control unit 50 which is operatively connected with each auxiliary semiconductor switching element 32.

Such a semiconductor switching string 10 may, as shown in FIG. 1, include a plurality of individual control units 50, each of which is arranged in direct, operative communication with a single corresponding semiconductor switching element 32. Alternatively a plurality of, or indeed all of, the semiconductor switching elements 32 within a given semiconductor switching string 10 may share a single control unit (not shown).

In the embodiment shown, each control unit 50 is configured to switch the corresponding auxiliary semiconductor switching element 32 into a conducting state, i.e. turn on the self-commutated semiconductor switch 36 located therein, to create an alternative current path 52 (only one such path shown in FIG. 1 for clarity) between the first and second terminals 20, 24 of the corresponding main thyristor 16, 16', 16", via which current is diverted through the corresponding resistive element 34.

In addition, each control unit 50 is further configured to have all of the auxiliary semiconductor switching elements 32, i.e. all of the self-commutated semiconductor switches 36 therein, in their conducting state simultaneously while each main semiconductor switching element 14, i.e. each main thyristor 16, 16', 16", is first operating in its reverse recovery mode and then in its blocking mode.

Accordingly, each control unit 50 is configured to turn on its associated auxiliary semiconductor switching element 32 while the corresponding main thyristor 16, 16', 16" is operating in its reverse recovery condition (although in other embodiments of the invention this may be prior to the corresponding main thyristor 16, 16', 16" operating in its reverse recovery condition), and to turn the said associated auxiliary semiconductor switching element 32 off once the said corresponding main thyristor 16, 16', 16" has completed its reverse recovery and is operating in its blocking mode.

In other embodiments of the invention, however, the or each control unit 50 may be configured to have all of the auxiliary semiconductor switching elements 32 in their conducting state simultaneously only while each main semiconductor switching element 14 is operating in one or other of its reverse recovery mode and its blocking mode.

As such, one or more of the control units 50 in other embodiments of this nature may instead be configured to turn on its associated auxiliary semiconductor switching element 32 at the same time as the main thyristor 16, 16', 16" begins to operate in its blocking mode.

Each control unit 50 may be configured in each of the aforementioned manner by being individually programmed and able to coordinate its operation with each of the other control units 50, or by being instructed to operate as required by, e.g. a higher-level controller.

In embodiments including only one, or a reduced number of shared control units, the or each such control unit may be configured in a similar way, i.e. individually programmed and able to coordinate its operation, or instructed to operate as required by some higher-level entity.

Returning to the embodiment shown, a practical way in which the control units 50 are able to ensure that all of the auxiliary semiconductor switching elements 32 are in their conducting state simultaneously while each main thyristor 16, 16', 16" is operating in both its reverse recovery mode and then its blocking mode, is to configure the control units 50 to have all of the auxiliary semiconductor switching elements 32 in their said conducting state simultaneously a predetermined period of time after a given reference point in the operating cycle of the semiconductor switching string 10.

Possible reference points within such an operating cycle are:
the dispatch of a switch-on signal, e.g. from a higher-level controller, to each main semiconductor switching element 14, i.e. each main thyristor 16, 16', 16";
the dispatch of a switch-on signal, e.g. from a higher-level controller, to a further semiconductor switching string with which the semiconductor switching string 10 of an embodiment is operatively associated, e.g. a further semiconductor switching string in a different limb portion of a HVDC power converter in which the semiconductor switching string 10 of an embodiment is located; or
a zero voltage arising across one or both of the main thyristor 16, 16', 16" and the semiconductor switching string 10.

In any event, each control unit 50 is additionally configured to subsequently turn off simultaneously all of the auxiliary semiconductor switching elements 32. This simultaneously stops the flow of current through each auxiliary circuit 30 and its associated resistive element 34, current which was previously flowing via the associated alternative current path 52 temporarily created by turning on the said auxiliary semiconductor switching element 32.

As indicated above, each control unit 50 is configured to turn off its associated auxiliary semiconductor switching element 32 after the corresponding main thyristor 16, 16', 16" has completed its reverse recovery, i.e. once the corresponding main thyristor 16, 16', 16" is operating in its blocking mode.

However, in other embodiments of the invention, one or more of the control units 50 may be configured to turn off its associated auxiliary semiconductor switching element 32 while the corresponding main thyristor 16, 16', 16" is in the late stages of reverse recovery, i.e. slightly before the main thyristor 16, 16', 16" begins to operate in its blocking mode and as the reverse recovery current in flowing through the main thyristor 16, 16', 16" approaches zero.

Again, a practical way in which the control units 50 can simultaneously turn off all of the auxiliary semiconductor switching elements 32 at a desired point is to do so following an event experienced within the semiconductor switching string 10.

Such an event may be one of:
(a) the turning on of each auxiliary semiconductor switching element 32;
(b) a peak voltage arising across one or both of the corresponding main thyristor 16, 16', 16" and the semiconductor switching string 10;
(c) the receipt of a dedicated turn-off signal for each auxiliary semiconductor switching element 32 from a higher-level controller;
(d) a stabilisation of the current flowing through each auxiliary circuit 30; or
(e) a stabilisation of the voltage across one or both of the main thyristor 16, 16', 16" and the semiconductor switching string 10.

In use the semiconductor switching string 10 illustrated in FIG. 1 operates as follows, with reference being made to FIG. 2 which shows the current flowing through a main thyristor 16, 16', 16", i.e. a thyristor current $i_{thy}$, and the current flowing through the corresponding auxiliary circuit 30, i.e. an auxiliary current $i_{aux}$, within a given semiconductor switching assembly 12 of the switching string 10, as well as the current flowing through the switching string 10 itself, i.e. a string current $i_{string}$.

While each main semiconductor switching element 14, i.e. each main thyristor 16, 16', 16", is switched on and operating in its respective conducting mode (as illustrated during a first period 54 in FIG. 2) a positive conducting current $i_c$ is able to flow from the first terminal 20 to the second terminal 24 of each main thyristor 16, 16', 16", and hence through the semiconductor switching string 10 as a whole via each semiconductor switching assembly 12. Hence each of the thyristor current $i_{thy}$ and the string current $i_{string}$ is equal to the conducting current $i_c$. Meanwhile each auxiliary semiconductor switching element 32 is switched off, i.e. is in its non-conducting state, and so the current flowing through each corresponding auxiliary circuit 30, i.e. the auxiliary current $i_{aux}$ is zero.

When each main thyristor 16, 16', 16" is turned off, i.e. when the conducting current is flowing through them is forced to zero and they become reverse-biased, they first operate in their reverse recovery mode (as illustrated during a second period 56 in FIG. 2) in which a reverse recovery current $i_{rr}$ is able to flow from the second terminal 24 to the first terminal 20 thereof.

Initially during this second period 56 both the thyristor current $i_{thy}$ and the string current $i_{string}$ are equal to the reverse recovery current $i_{rr}$ and the auxiliary current $i_{aux}$ remains at zero.

The turn on 58 of each auxiliary semiconductor switching element 32 takes place prior the corresponding main thyristor 16, 16', 16" beginning 66 to support a voltage and while the corresponding main thyristor 16, 16', 16" is operating in its reverse recovery mode. Such turn on 58 causes current, i.e. current flowing from the preceding semiconductor switching assembly 12 in the semiconductor switching string 10, to be diverted through the corresponding auxiliary circuit 30 and the resistive element 34 lying therein. Such current is initially shared between the main thyristor 16, 16', 16" and the corresponding auxiliary circuit 30.

Thereafter, as each such main thyristor 16, 16', 16" continues to recover, i.e. transitions to being able to block current while operating in its blocking mode, the auxiliary current $i_{aux}$, i.e. the current flowing through both the semiconductor switch 36 and resistive element 34 of each auxiliary circuit 30, increases while the thyristor current $i_{thy}$ falls. During the same period the string current $i_{string}$ increases and then falls.

Once each main thyristor 16, 16', 16" has transitioned to its blocking mode (as illustrated during a third period 60 in FIG. 2) no current flows between the first and second terminals 20, 24 thereof, and hence the thyristor current $i_{thy}$ is zero. In the meantime all the auxiliary semiconductor switching elements 32 remain simultaneously in their conducting state, i.e. all of the auxiliary semiconductor switching elements 32 and their respective associated auxiliary circuit 30 are in an operative configuration at the same time, and so the current continuing to flow through the semiconductor switching string 10 is made up solely of the current flowing through each auxiliary circuit 30. As a consequence the string current $i_{string}$ becomes equal to the auxiliary current $i_{aux}$.

At this stage the semiconductor switching string 10 is essentially a string of auxiliary circuits 30 since each main thyristor 16, 16', 16" has recovered its voltage blocking capability, i.e. is operating in its blocking mode, and so effectively defines an open circuit. As a consequence the voltage across each main thyristor 16, 16', 16", i.e. each main semiconductor switching element 14, is determined solely by the voltage across the resistive element 34 in the corresponding auxiliary circuit 30 which is electrically connected between the first and second terminals 20, 24 of the said main thyristor 16, 16', 16".

Moreover, since the resistance value of each resistive element 34 is the same, the voltage v, v', v" across each main thyristor 16, 16', 16" is also the same, as illustrated in FIG. 2. Consequently the voltage across the whole semiconductor switching string 10 is shared equally amongst the various main thyristors 16, 16', 16".

Simultaneous turn off 62 of each auxiliary semiconductor switching element 32, i.e. each self-commutated semiconductor switch 34, results in a temporary voltage overshoot across each said auxiliary semiconductor switching element 32 and associated snubber circuit 44, which in turn appears as a voltage overshoot 64 across each corresponding main thyristor 16, 16', 16". However, current is stopped from flowing through each corresponding auxiliary circuit 30 and so the auxiliary current faux drops to zero and the voltage v, v', v" across each main thyristor 16, 16', 16" returns to being the same, equal shared value.

In still further embodiments of the invention (not shown) one or more of the semiconductor switching assemblies may include a modified auxiliary semiconductor switching element in which the series-connected diode is replaced by a further self-commutated semiconductor switch which is connected in an opposite sense to the original self-commutated semiconductor switch, such that the modified auxiliary semiconductor switching element is able to provide a symmetrical voltage blocking capability. In such embodiments, the control unit operatively associated with the modified auxiliary semiconductor switching element may be still further configured to have the said modified auxiliary semiconductor switching element in its conducting state while the corresponding main thyristor is operating in its conducting mode.

Such switching on of the modified auxiliary semiconductor switching element provides a current discharge path for the capacitor within a snubber circuit connected in parallel across the said modified auxiliary semiconductor switching element, through the auxiliary semiconductor switching element rather than through the corresponding main thyristor, and so reduces the current stress that the main thyristor experiences compared to that it would otherwise experience when switching into its conducting mode, i.e. when turning on.

Once the capacitor has discharged the current flowing through the auxiliary semiconductor switching element falls to zero and the auxiliary semiconductor switching element can be turned off in order to save power. It can be turned on again, as needed, nearer the time of the corresponding main semiconductor switching element operating in its reverse recovery mode. Alternatively it can remain on for the whole time for which the corresponding main semiconductor switching element operates in its conducting mode.

The invention claimed is:

1. A semiconductor switching string, for use in a HVDC power converter, comprising:

a plurality of series-connected semiconductor switching assemblies, each semiconductor switching assembly having a main semiconductor switching element, each main semiconductor switching element when switched on operating in a conducting mode in which a conducting current flows from a first terminal thereof to a second terminal thereof, each main semiconductor switching element while turning off transitioning from a reverse recovery mode in which a reverse recovery current flows from the second terminal to the first terminal to a blocking mode in which no current flows between the first terminal and second terminal, each main semiconductor switching element having an active auxiliary circuit electrically connected between the first and second terminals thereof, and each active auxiliary circuit including an auxiliary semiconductor switching element and a resistive element connected in series with one another; and a control unit operatively connected with each auxiliary semiconductor switching element, the control unit being configured to switch a respective auxiliary semiconductor switching element into a conducting state to divert current through the corresponding resistive element, and the control unit being further configured to switch on all of the auxiliary semiconductor switching elements in their conducting state simultaneously when each main semiconductor switching element initiates a reverse recovery mode, whereby when a given main semiconductor switching element transitions to operating in its blocking mode a voltage thereacross is determined solely by a voltage across the resistive element in the corresponding active auxiliary circuit electrically connected between the first and second terminals of the said given main semiconductor switching element.

2. The semiconductor switching string according to claim 1 wherein the control unit is further configured to subsequently turn off simultaneously all of the auxiliary semiconductor switching elements to simultaneously stop the flow of current through each auxiliary circuit and associated resistive element.

3. The semiconductor switching string according to claim 2 wherein the control unit is configured to simultaneously turn off all of the auxiliary semiconductor switching elements following an event experienced within the semiconductor switching string.

4. The semiconductor switching string according to claim 3 wherein the event is one of:
the turning on of each auxiliary semiconductor switching element;
a peak voltage arising across one or both of the corresponding main semiconductor switching element and the semiconductor switching string;
the receipt of a dedicated turn-off signal from a higher-level controller;
a stabilization of the current flowing through each auxiliary circuit; and
a stabilization of the voltage across one or both of the corresponding main semiconductor switching element and the semiconductor switching string.

5. The semiconductor switching string according to claim 1 wherein the resistive element in each auxiliary circuit has a resistance value which results in the amount of current that continues to flow through the resistive element once the corresponding main semiconductor switching element is operating in its blocking mode equating to at least 10% of a peak reverse recovery current flowing through the said corresponding main semiconductor switching element when it is operating in its reverse recovery mode.

6. The semiconductor switching string according to claim 5 wherein the resistive element in each auxiliary circuit has a resistance value which results in the amount of current that continues to flow through the resistive element once the corresponding main semiconductor switching element is operating in its blocking mode equating to between 30% and 40% of a peak reverse recovery current flowing through the said corresponding main semiconductor switching element when it is operating in its reverse recovery mode.

7. The semiconductor switching string according to claim 1 wherein the resistive element in each auxiliary circuit has the same resistance value.

8. The semiconductor switching string according to claim 1 wherein each auxiliary semiconductor switching element includes at least one self-commutated semiconductor switch.

9. The semiconductor switching string according to claim 8 wherein each self-commutated switch includes a snubber circuit connected in parallel thereacross.

10. The semiconductor switching string according to claim 9 wherein the control unit is still further configured to have at least one auxiliary semiconductor switching element in its conducting state while the corresponding main semiconductor switching element is operating in its conducting mode.

11. The semiconductor switching string according to claim 1 wherein the control unit is configured to have all of the auxiliary semiconductor switching elements in their conducting state simultaneously a predetermined period of time after a given reference point in the operating cycle of the semiconductor switching string.

12. The semiconductor switching string according to claim 11 wherein the given reference point is one of:
dispatch of a switch-on signal to each main semiconductor switching element;
dispatch of a switch-on signal to another semiconductor switching string with which the semiconductor switching string is operatively associated; and
a zero voltage arising across one or both of the corresponding main semiconductor switching element and the semiconductor switching string.

* * * * *